United States Patent [19]

Fields

[11] 4,118,664
[45] Oct. 3, 1978

[54] ELECTRICAL TROUBLE FINDING APPARATUS

[76] Inventor: Paul Fields, 191 Palisade Ave., Yonkers, N.Y. 10703

[21] Appl. No.: 674,232

[22] Filed: Apr. 6, 1976

[51] Int. Cl.² ............................................. G01R 31/02
[52] U.S. Cl. ..................... 324/51; 324/133; 340/635
[58] Field of Search ............... 324/54, 52, 115, 53, 324/133, 51; 340/248 R, 248 E

[56] References Cited

U.S. PATENT DOCUMENTS

| | | | |
|---|---|---|---|
| 2,676,300 | 4/1954 | Hirsch et al. | 324/115 |
| 2,697,216 | 12/1954 | Lee | 324/133 |
| 2,864,999 | 12/1958 | Sullivan | 324/115 |
| 3,016,488 | 1/1962 | Smith et al. | 324/115 |
| 3,584,299 | 6/1971 | Csete | 324/115 |
| 3,812,420 | 5/1974 | Gunter | 324/52 |

FOREIGN PATENT DOCUMENTS 215,168  8/1940  Fed. Rep. of Germany ........... 324/115

Primary Examiner—Rudolph V. Rolinec
Assistant Examiner—Michael J. Tokar
Attorney, Agent, or Firm—Spellman and Joel

[57] ABSTRACT

An electric trouble finding apparatus comprises means to test either hot or cold circuits with a single unit. The apparatus comprises a first pair of binding posts which serve as the coupling means to a hot output and a second pair of binding posts which may serve simultaneously as connecting means to a cold or inert circuit. The unit includes a four pole double throw switch having a single lever control and a plurality of twelve terminals in the switch arrangement. A first pair of oppositely positioned switch terminals are connected to an AC power source while a second pair of opposite terminals in the switch are connected to respective hot binding posts. One of the cold binding posts is connected through a lamp to a terminal in the switch while the opposite terminal is coupled to the other cold binding post. A pair of terminals in the switch are interconnected while another pair of terminals in the switch are coupled to the hot outlet from the power supply. Thus, it is possible with a single, relatively simple and inexpensive apparatus to detect faults in either hot or cold circuits or components by merely moving the lever control.

5 Claims, 4 Drawing Figures

ELECTRICAL TROUBLE FINDING APPARATUS

BACKGROUND OF THE INVENTION

This invention relates to an electrical trouble finding apparatus and particularly to an apparatus which may be used to detect faults in either hot or cold circuits.

The prior art includes U.S. Pat. No. 3,800,214 to O'Flynn which discloses a device of fairly complex circuitry which can be utilized for testing both hot and cold circuits with the indication appearing as the deflection of an ammeter. U.S. Pat. No. 3,064,186 to Vincent discloses a device which shows the flow of current either in a cold system or hot system by means of small lights or liquid crystal elements and is rather simple in its circuitry design. Rather than utilizing a switch, however, Vincent uses multiple socket type connectors to which the circuit probes are attached.

Another device which is more complex and more difficult to use than the present invention is disclosed in U.S. Pat. No. 1,835,882 to Krippner.

Further patents of interest include U.S. Pat. No. 3,829,763 to Morin and U.S. Pat. No. 2,548,991 to McNabb. Generally, the prior art devices are considerably more complicated and expensive than the unit disclosed herein. Furthermore, the present invention provides an improved electrical trouble finding unit which may be carried and used by individuals without a great deal of instruction thereby considerably expanding its use.

SUMMARY OF THE INVENTION

The present invention relates to an electrical trouble finding apparatus for electrical circuits and components.

The invention comprises a four pole double throw switch connected to a first pair of binding posts and also connected to a second pair of binding posts by means of a lever control The switch includes oppositely positioned terminal pairs. An AC power source is coupled to a pair of oppositely situated terminals in switch and by means of interconnected wires to a second pair of oppositely connected terminals in the switch. A pair of terminals in the switch are connected to a pair of hot binding posts while another pair of terminals in the switch are connected to a pair of cold binding posts, one of said lines having a lamp connected therein. The forward terminals in the switch are isolated while the rear terminals in the switch are connected to each other.

In operation, the hot binding posts are energized or hot when the switch is in the rear position and the test leads from the cold binding posts are de-energized or cold. Voltage may be applied to any part or portion of the circuit from the hot binding posts while at the same time, the cold binding posts which are now cold may receive voltage. The combined use of cold binding posts and hot binding posts permits a fairly wide range of testing especially if the user has knowledge of the circuits and the components involved. The entire unit may also be packaged into an extremely small area, for example, a 3 inch × 6¼ inch × 1⅜ inch plastic case.

Accordingly, an object of this invention is to provide a new and improved electrical trouble finding apparatus.

Another object of this invention is to provide a new and improved electrical trouble finding apparatus which may be used to test either hot or cold circuits.

A more specific object of this invention is to provide a new and improved electrical trouble finding apparatus which is small, inexpensive, and easy to use and which may be used to test a variety of circuits under different conditions.

BRIEF DESCRIPTION OF THE DRAWINGS

Other objects and advantages of this invention may be seen from the following description when viewed in conjunction with the accompanying drawings wherein.

DETAILED DESCRIPTION OF THE INVENTION

Figure 1:
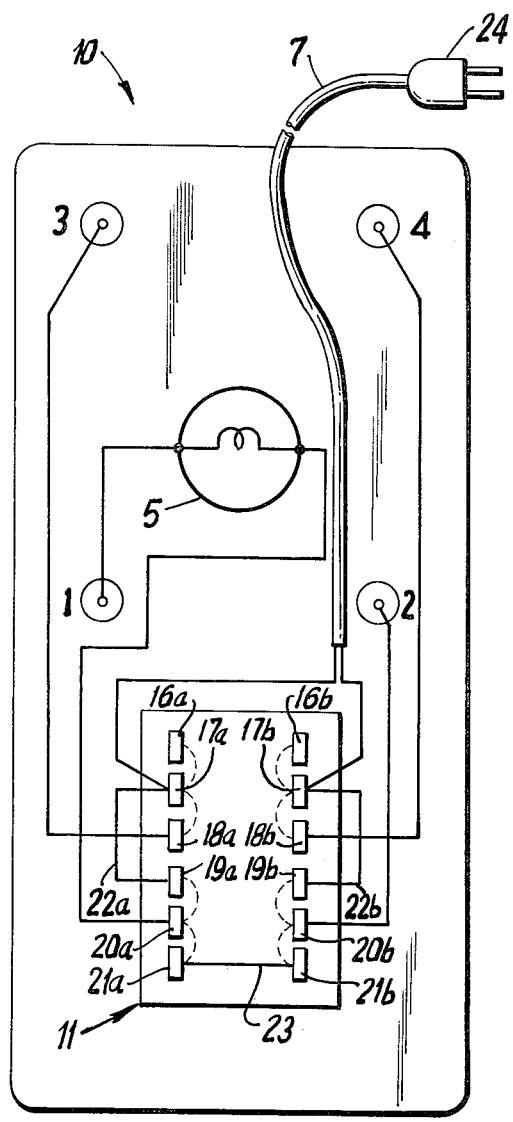
FIG. 1 is a schematic circuit drawing of the invention showing the various components thereof.
Figure 3:
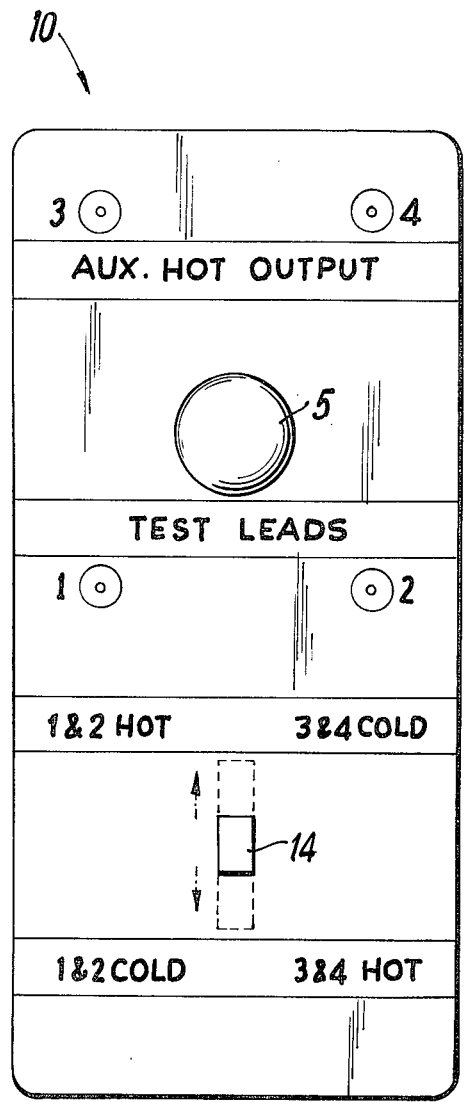

Referring now to FIG. 1 of the drawings, the electrical trouble finding apparatus 10 comprises a switching arrangement 11 which includes a four pole double throw switch and a single lever control 14 which activates the switch. The switching arrangement 11 with the terminals aligned for operation by the single control lever 14 functions in a conventional manner. The switch 11 includes a plurality of aligned terminals 16a–21a which are positioned opposite a plurality of corresponding terminals 16b–21b in a pair relationship.

The trouble finding apparatus 10 also includes a first pair of binding posts 3 and 4 to which alligator leads or similar connecting leads may be attached. These binding posts 3 and 4 are known as the hot binding posts and are located towards one end of the unit 10. In an intermediate portion of the unit 10, a second pair of binding posts 1 and 2 are mounted and said posts 1 and 2 are generally the cold binding posts of the unit. The binding post 1 is connected to terminal 20a of switch 11 through a lamp 5 which serves as an indicating means as will be described in full detail hereinafter. A power supply is coupled to the switch unit 11 and in the preferred embodiment illustrated in FIG. 1 an AC line 7 having plug 24 at one end thereof is depicted for coupling the unit to said power source. The plug 24 is connected to intermediate terminal 17a and 17b of switch 11 and through interconnecting wires 22a and 22b to the forward terminal of switch 11. The rear terminals 21a and 21b of the switch are connected to one another by line 23.

Figure 2A:
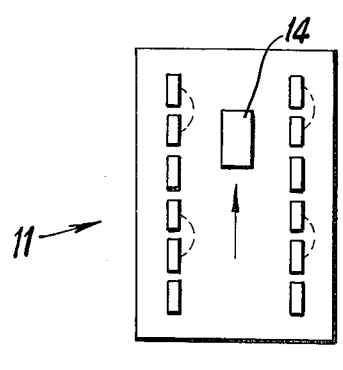
FIGS. 2a and 2b show a schematic illustration of the operation of the four pole double throw switch, and, FIG. 3 shows a top view of the packaged unit.
Figure 2B:
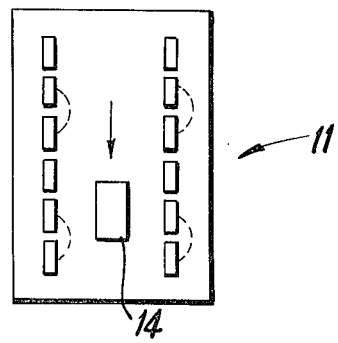

As shown in FIGS. 2a and 2b, the lever control 14 may be moved forward as shown in FIG. 2a or backwards as shown in FIG. 2b. With the switch unit in the forward position of FIG. 2a, the binding posts 3 and 4 are disconnected and the binding posts 1 and 2 are energized. Similarly, when the control lever 14 is in a rear position, binding posts 3 and 4 are energized and binding posts 1 and 2 are de-energized.

In operation, a conventional AC line cord 7 having a plug 24 mounted on the end thereof is connected to an AC power supply not shown. In lieu thereof, connecting wires with alligator clips or the like may be used for coupling to a conventional power supply. The invention is used mainly to detect electric trouble encountered by homeowners and apartment superintendents who often do not need or have an electrician available. Consequently, the unit 10 may be used to receive conventional 115 volt power supply or provide the power supply to units being tested. It can most expeditiously be used to check fuses, light bulb switches, etc. whether they are installed or removed from their units.

The lamp 5, in the preferred embodiment, may be a 7 watt, 115 volt lamp which provides a visual indication of the results of the testing. The unit 10 is necessarily simple and may be used by even inexperienced individuals to detect troublesome faults in electrical circuits.

With the switch arrangement 11, binding posts 3 and 4 become energized or hot when the test leads from binding posts 1 and 2 are de-energized or cold. This arrangement permits the application of voltage to any part, portion or segment of the circuit and at the same time permits the checking at the portion of the test leads 1 and 2 which are now cold and will receive voltage. When posts 1 and 2 are energized or hot, the terminals 3 and 4 are disconnected from the voltage source. The test unit permits the use of binding posts 1 and 2 cold and 3 and 4 hot in order to provide a far wider range of testing, especially if the user has knowledge of the circuit and components involved.

The unit may be used to check all types of 115 volt fuses, light bulbs, switches, wall and baseboard outlets, etc., and can also be used for household and workshop electric tools. Further, it can be used to detect faulty or broken house wiring and to identify hot or grounded wires. It is ideal for checking continuity of 115 volt wiring in apparatus such as motors, etc. In checking electric components such as fuses, the fuses should be placed on an insulated surface and the line cord 7 should be coupled to the power supply. The switch lever 11 is operated by moving the control switch 14 forward in the position marked HOT TEST LEADS 115 VOLTS. Both ends of the test leads are touched together to check the light in the tester. When the leads are touched together, the bulb should light.

To check a screw type fuse, the fuse should be placed on its face and the point of one test lead on the disc at the base of the fuse. Then the points of the other test leads should be attached to the screw side of the fuse and if everything is satisfactory, the bulb will light. To check a cartridge fuse, it should be laid on an insulated surface and a test lead touched to each end. Similar use of test leads may be used to check light bulbs, etc. and the continuity of wire on toasters, electric irons, motors, and the like in order to locate a broken wire or a faulty connection and switches.

With the control switch lever 14 in the position receiving 115 volts, a component such as a fuse box, knife switch box or reset box may be checked for voltage anywhere and at any point at which you know you should have 115 volts. To do so, you must be sure that the black lead point is in good contact with the grounded surface such as a fuse box, etc. When making checks of this nature, the AC line cord may be removed from the test unit making it easier to handle.

While the invention has been explained by a detailed description of certain specific embodiments, it is understood that various modifications and substitutions can be made in any of them within the scope of the appended claims which are intended also to include equivalents of such embodiments.

What is claimed is:

1. An electrical trouble finding apparatus for testing a variety of units comprising:
    a case,
    a manually actuated four pole double throw switch controlling the trouble finding operation of the apparatus,
    a first pair of spaced binding posts coupled to the switch and protruding upwardly from the case at one end thereof,
    a second pair of spaced binding posts coupled to said switch and protruding upwardly from the case at an intermediate portion thereof,
    indicating means connected to the second pair of posts for indicating trouble in a unit,
    a power supply, and,
    a control lever mounted on the case and coupled to the switch whereby the first pair of binding posts may be coupled to the power supply through the switch to provide power to a unit under test connected between said first pair of binding posts, and the second pair of binding posts are simultaneously in a de-energized condition so that live units may be coupled therebetween for testing.

2. An electrical trouble finding apparatus in accordance with claim 1 wherein:
    the switch includes a plurality of terminal pairs with the corresponding terminal of each pair being in alignment.

3. An electrical trouble finding apparatus in accordance with claim 2 wherein:
    the switch includes six pairs of terminals, means connecting the first pair of binding posts to a first intermediate pair of opposite terminals and the second pair of binding posts to a second intermediate pair of opposite terminals, means connecting the power supply to a pair of terminals on one side of the first pair of intermediate terminals and to a pair of terminals located between the first and second pairs of intermediate terminals, a pair of connected terminals at one end adjacent the second pair of intermediate terminals and a pair of unconnected terminals at the other end adjacent the pair of terminals connected to the power supply, all of said terminals being coupled to the control lever for actuation thereby.

4. An electrical trouble finding apparatus in accordance with claim 1 wherein:
    the power supply comprises an AC outlet and the apparatus includes an AC line cord connected to the switch, and,
    the indicator means comprises a lamp.

5. An electrical trouble finding apparatus in accordance with claim 1 wherein:
    two poles of the switch are on one side of the switch including their related throw terminals and the other two poles of the switch are on the opposite side of the switch including their related throw terminals.

* * * * *